(12) United States Patent
Kim

(10) Patent No.: US 12,279,484 B2
(45) Date of Patent: Apr. 15, 2025

(54) ORGANIC LIGHT EMITTING DIODES

(71) Applicant: LG Display Co., Ltd., Seoul (KR)

(72) Inventor: YongCheol Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 433 days.

(21) Appl. No.: 17/846,881

(22) Filed: Jun. 22, 2022

(65) Prior Publication Data

US 2023/0061856 A1    Mar. 2, 2023

(30) Foreign Application Priority Data

Aug. 10, 2021   (KR) .......... 10-2021-0105230

(51) Int. Cl.
*H10K 59/122*   (2023.01)
*H10K 59/12*    (2023.01)
*H10K 59/126*   (2023.01)
*H10K 59/38*    (2023.01)
*H10K 59/40*    (2023.01)
*H10K 59/80*    (2023.01)

(52) U.S. Cl.
CPC ......... *H10K 59/122* (2023.02); *H10K 59/126* (2023.02); *H10K 59/38* (2023.02); *H10K 59/40* (2023.02); *H10K 59/80518* (2023.02); *H10K 59/80524* (2023.02); *H10K 59/8791* (2023.02); *H10K 59/8792* (2023.02); *H10K 59/1201* (2023.02)

(58) Field of Classification Search
CPC ....................................... H10K 59/126
See application file for complete search history.

(56) References Cited

U.S. PATENT DOCUMENTS

2021/0118962 A1*   4/2021   Shin ................ H10K 59/8792

* cited by examiner

*Primary Examiner* — Zandra V Smith
*Assistant Examiner* — Molly K Reida
(74) *Attorney, Agent, or Firm* — Fenwick & West LLP

(57) ABSTRACT

An organic light emitting diode which suppresses external light reflection while reducing loss of light generated in an organic light emitting layer is disclosed. An organic light emitting diode includes a substrate, an anode on the substrate, a bank on the anode and exposing a part of the anode to define an emission area, an organic light emitting layer on the emission area and the bank, a cathode on the organic light emitting layer, a plurality of light shielding patterns on the cathode and overlapping the bank, and a light loss inducing layer located on a same plane as the plurality of light shielding patterns and disposed between a pair of light shielding patterns from the plurality of light shielding patterns, the light loss inducing layer having has a same thickness as a thickness of that of the plurality of light shielding patterns, and overlaps the emission area.

20 Claims, 19 Drawing Sheets

ORGANIC LIGHT EMITTING DIODES

CROSS-REFERENCE TO RELATED APPLICATION

This application claims the priority benefit of Republic of Korea Patent Application No. 10-2021-0105230 filed on Aug. 10, 2021, which is hereby incorporated by reference in its entirety.

BACKGROUND

Technical Field

The present disclosure relates an organic light emitting diode which suppresses external light reflection while reducing loss of light generated in an organic light emitting layer.

Description of the Related Art

Recently, as society enters the full-scale information era, interest in information display which processes and displays a large amount of information is increasing. Further, as the demand for use of portable information media increases, various light and thin flat panel display devices corresponding to this have been developed to be in the spotlight.

Specifically, among various flat panel display devices, organic light emitting diodes (OLED) are self-emitting devices so that a backlight used for a liquid crystal display device (LCD) which is a non-self-emitting device is not necessary so that light weight and thin thickness can be achieved.

Further, the organic light emitting diode has advantages in that the viewing angle and the contrast ratio are excellent as compared with the liquid crystal display device, the power consumption is also advantageous, it is driven at a low direct current (DC) voltage, a response speed is fast, and it is strong to the external impact because of the solid internal component, and an available temperature range is wide.

In the meantime, in the general organic light emitting diodes, a circular polarizer is located on an upper surface of a display panel to reduce the reflection by various wiring lines or electrodes formed of metal.

The circular polarizer is configured by a retardation plate and a linear polarizer. The retardation plate is configured by a quarter wave plate (QWP) having a phase retardation value of $\frac{1}{4}\lambda$ and the linear polarizer has a polarization axis and linearly polarizes light in the polarization axis direction.

When the circular polarizer is located such that the retardation plate is located on an upper surface of the display panel and the linear polarizer is located above the retardation plate, reflection is generated in the display panel due to external light. Further, when the reflected light comes out to the outside, the reflected light cannot pass through the linear polarizer so that external light reflectivity is reduced.

However, as described above, when the circular polarizer is located on the upper surface of the display panel, there is a problem in that the overall luminance of the organic light emitting diode is also reduced. That is, a transmittance of the circular polarizer is approximately 40% to 50% so that the luminance of the light generated in an organic light emitting layer is reduced by 50% or more while passing through the circular polarizer.

Accordingly, studies are actively being conducted to reduce the loss of the luminance while reducing the external light reflectivity of the organic light emitting diode without using the circular polarizer.

SUMMARY

An object of the present disclosure is to provide an organic light emitting diode which suppresses the external light reflection while reducing loss of light generated in the organic light emitting layer.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, an organic light emitting diode includes: a substrate, an anode on the substrate, a bank on the anode, the bank exposing a part of the anode to define an emission area; an organic light emitting layer on the emission area and the bank; a cathode on the organic light emitting layer; a plurality of light shielding patterns configured to absorb light incident on the plurality of light shielding patterns, the plurality of light shielding patterns on the cathode and overlapping the bank but non-overlapping with the emission area; and a light loss inducing layer configured to reduce emission of reflected external light, the light loss inducing layer overlapping the emission area and on a same plane as the plurality of light shielding patterns such that the light loss inducing layer is disposed between a pair of light shielding patterns from the plurality of light shielding patterns, the light loss inducing layer having a same thickness as a thickness of the plurality of light shielding patterns.

In one embodiment, an organic light emitting diode, comprises: a plurality of light shielding patterns on the substrate; a light loss inducing layer between the plurality of light shielding patterns such that the light loss inducing layer is disposed between a pair of light shielding patterns from the plurality of light shielding patterns; a first insulating layer in direct contact with a first surface of the light loss inducing layer; and a second insulating layer in direct contact with a second surface of the light loss inducing layer that is farther from the substrate than the first surface of the light loss inducing layer, wherein a refractive index of the light loss inducing layer is less than a refractive index of the first insulating layer and less than a refractive index of the second insulating layer.

In one embodiment, a manufacturing method of an organic light emitting diode comprises: forming an anode on a substrate; forming a bank on the anode, the bank exposing a part of the anode to define an emission area; forming an organic light emitting layer on the emission area and the bank; forming a cathode on the organic light emitting layer; and forming a plurality of light shielding patterns and a light loss inducing layer on the cathode, the plurality of light shielding patterns configured to absorb light incident on the plurality of light shielding patterns, and the light loss inducing layer configured to reduce emission of reflected external light, wherein the plurality of light shielding patterns overlaps the bank, and the light loss inducing layer overlaps the emission area and is located on a same plane as the plurality of light shielding patterns such that the light loss inducing layer is disposed between a pair of light shielding patterns from the plurality of light shielding patterns, the light loss inducing layer having a same thickness as a thickness of the plurality of light shielding patterns.

As described above, the organic light emitting diode according to the present disclosure includes a light loss inducing layer located on the organic light emitting layer and a light shielding pattern adjacent to the light loss inducing layer to suppress the external light reflection while reducing loss of light generated in the organic light emitting layer.

Further, the organic light emitting diode according to the present disclosure includes a touch electrode overlapping the light shielding pattern to show excellent touch performance while reducing the reduction of the aperture ratio.

Further, the organic light emitting diode according to the present disclosure includes a transmittance control layer or a color filter layer located so as to correspond to a transmitting direction of light emitted through the organic light emitting layer so that the external light reflection can be suppressed without providing a separate circular polarizer.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
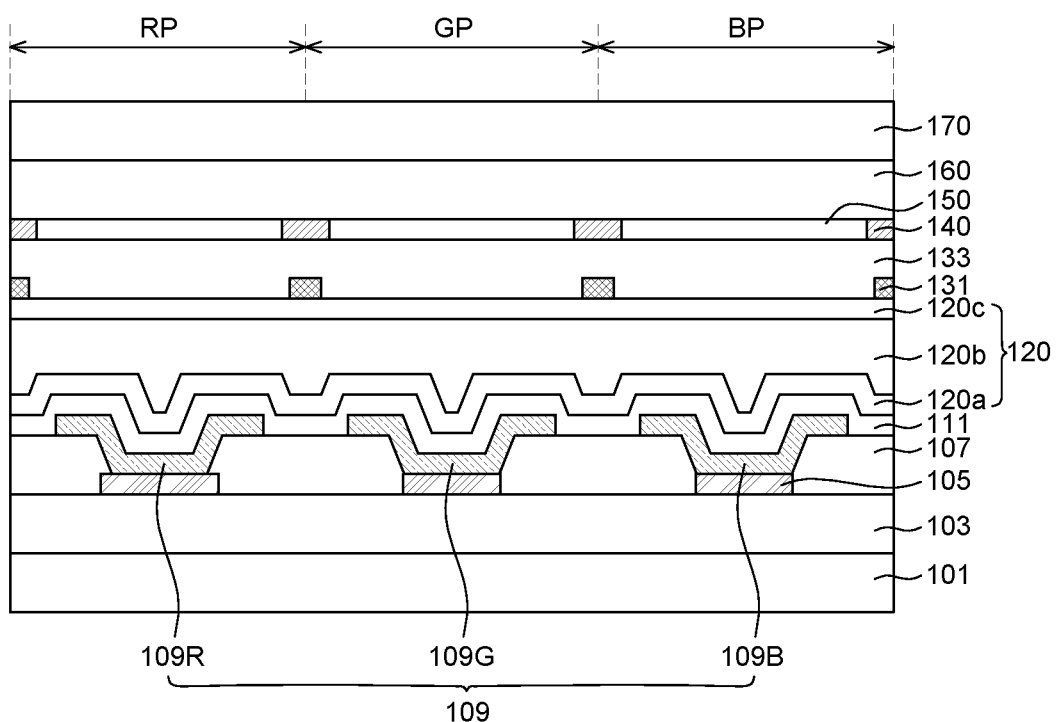
FIG. 1 is a cross-sectional view illustrating a structure of a unit pixel including three sub pixels in an organic light emitting diode according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

Figure 2:
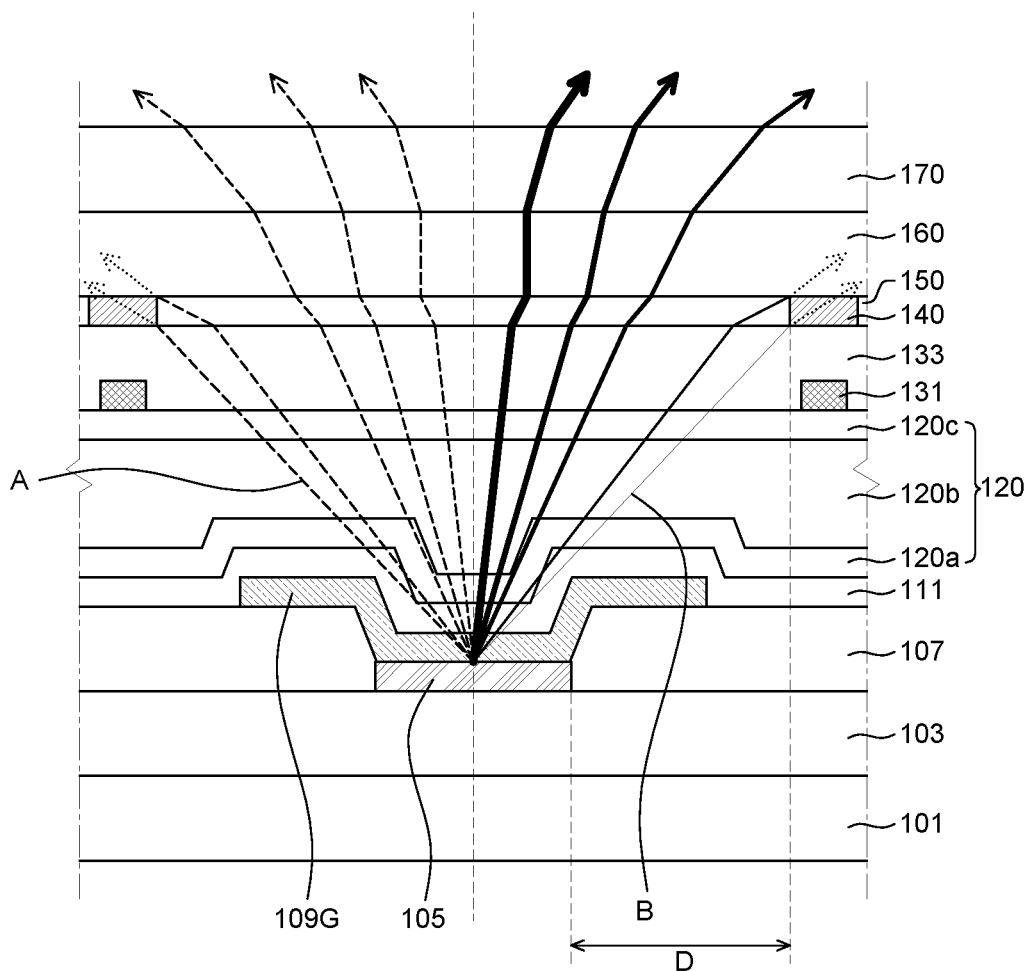
FIG. 2 is a cross-sectional view enlarging a green sub pixel part of FIG. 1 and illustrating a path of reflected light and generated light according to the first exemplary embodiment of the present disclosure.

FIG. 1 is a cross-sectional view illustrating a structure of a unit pixel including three sub pixels RP, GP, and BP in an organic light emitting diode according to a first exemplary embodiment of the present disclosure. FIG. 2 is a cross-sectional view enlarging a green sub pixel GP part of FIG. 1 and illustrating a path of reflected light A and generated light B according to the first exemplary embodiment of the present disclosure.

First, referring to FIG. 1, an organic light emitting diode according to a first exemplary embodiment of the present disclosure may include a plurality of sub pixels. Even though in FIG. 1, a red sub pixel RP, a green sub pixel GP, and a blue sub pixel BP are illustrated, the present disclosure is not limited thereto so that a white sub pixel may be further included.

The organic light emitting diode including the plurality of sub pixels may include a substrate 101, a thin film transistor (TFT) layer 103, an anode 105, a bank 107, an organic light emitting layer 109, a cathode 111, an encapsulation layer 120, a touch electrode 131, a touch protection layer 133, a light shielding pattern 140, a light loss inducing layer 150, a transmittance control layer 160, and a cover layer 170.

The substrate 101 may serve to support components located there above. The substrate 101 may be formed of a solid glass material, but is not limited thereto and may be formed of a flexible plastic such as polyimide.

The TFT layer 103 may be located on the substrate 101. The TFT layer 103 may include a plurality of thin film transistors which drives the plurality of sub pixels RP, GP, and BP. Each of the plurality of thin film transistors may include an active layer formed of poly silicon or oxide semiconductor, a gate electrode overlapping the active layer, and source and drain electrodes which are in contact with both ends of the active layer. The TFT layer may include a switching thin film transistor and a driving thin film transistor and additionally include a compensation thin film transistor for compensating for a threshold voltage Vth and a mobility of the thin film transistor.

The anode 105 may be located on the TFT layer 103. A plurality of anodes 105 may be located on the TFT layer 103 and are spaced apart from each other. Specifically, one anode 105 may be located in one sub pixel. Thus, there is a one-to-one correspondence between each anode 105 and each sub-pixel. The anode 105 may be electrically connected to the driving thin film transistor located in the TFT layer 103.

The anode 105 may be a reflective electrode. In one exemplary embodiment of the present disclosure, the anode 105 may include silver (Ag) or aluminum (Al). In another exemplary embodiment of the present disclosure, the anode 105 may be formed with a multilayered structure such as ITO/Ag/ITO or IZO/Al/IZO. A surface reflectivity of the anode 105 may be 95% or higher.

The bank 107 may be located on the anode 105. The bank 107 may expose a part of the anode 105 to define an emission area. That is, the bank 107 may cover an edge of the anode 105. Specifically, the bank 107 is removed from a center portion of the anode 105 disposed in each of the red, green, and blue sub pixels RP, GP, and BP to form red, green, and blue emission areas.

The bank 107 may be formed of an organic material. In one exemplary embodiment of the present disclosure, the bank 107 is formed of polyimide, but is not limited thereto and is formed of an acrylic material. In another exemplary embodiment of the present disclosure, the bank 107 may be formed of an inorganic material such as silicon oxide SiOx or silicon nitride SiNx.

The bank 107 may include an inclined surface located to be adjacent to the anode 105 and flat surfaces located between two adjacent sub pixels. The inclined surface of the bank 107 has a normal taper shape and an angle of the inclined surface of the bank 107 may vary depending on a material of the bank 107.

The organic light emitting layer 109 may be located on the anode 105 and the bank 107. The organic light emitting layer 109 may include a red organic light emitting layer 109R which emits red light, a green organic light emitting layer 109G which emits green light, and a blue organic light emitting layer 109B which emits blue light. The red, green, blue organic light emitting layers 109R, 109G, and 109B may respectively be located on the red, green, and blue sub pixels RP, GP, and BP, respectively. As described above, the organic light emitting diode according to an exemplary embodiment of the present disclosure may emit red, green, and blue light for every sub pixel to implement full color with high luminance.

The organic light emitting layer 109 may be configured by a single layer comprising of an emission material, or configured by a multilayer of a hole injection layer, a hole transport layer, an emitting material layer, an electron transport layer and an electron injection layer to increase a luminous efficiency. Even though not illustrated in the drawing, the hole injection layer, the hole transport layer, the electron transport layer, and the electron injection layer may be common layers formed on the entire surface of the substrate 101.

The cathode 111 may be located on the organic light emitting layer 109. The cathode 111 is commonly formed on the entire surface of the substrate 101 to apply the same voltage to each sub pixel. The cathode 111 may include at least one of magnesium (Mg), silver (Ag), and ytterbium (Yb). Specifically, the cathode 111 may be formed of a multilayer of Mg/Ag or Mg/Yb.

The cathode 111 may be formed of a transflective electrode. Specifically, the cathode 111 is formed of a thin metal film to transmit a part of light incident onto the cathode 111 and reflect another part of the incident light.

When a predetermined voltage is applied to the anode 105 and the cathode 111, holes injected from the anode 105 and the electrons provided from the cathode 111 are transported to the organic light emitting layer 109 to form exciton. When the exciton is transited from an excited state to a ground state, the light is generated to be emitted in the form of visible ray. The emitted light is emitted toward the cathode 111. That is, the organic light emitting diode according to the exemplary embodiment of the present disclosure may be a top emission type.

The anode 105 of the exemplary embodiment of the present disclosure is a reflective electrode and the cathode 111 is formed as a transflective electrode so that light (generated light B) generated in the organic light emitting layer 109 resonates between the anode 105 and the cathode 111. The light resonating between the anode 105 and the cathode 111 causes constructive interference and a half-width on the optical profile will be shortened. Therefore, a large amount of the generated light B which is emitted toward the cathode is emitted to the front of the organic light emitting diode and the amount of emitted light is reduced toward the side surface of the organic light emitting diode. In other words, an amount of generated light B is increased toward a direction perpendicular to the anode 105. Therefore, even though the light shielding pattern 140 is located above the organic light emitting layer 109, generated light B which is lost by the light shielding pattern 150 may be reduced.

The encapsulation layer 120 may be disposed on the cathode 111. The encapsulation layer 120 may serve to protect the organic light emitting layer 109 from moisture and oxygen. The encapsulation layer 120 may be formed to cover the entire surface of the substrate 101.

The encapsulation layer 120 may be formed by sequentially laminating a first encapsulation layer 120a formed of an inorganic film, a second encapsulation layer 120b formed of an organic film, and a third encapsulation layer 120c formed of an inorganic film. Here, the second encapsulation layer 120b may perform a planarization function. In the meantime, the first and third encapsulation layers 120a and 120c are formed by a chemical vapor deposition method and the second encapsulation layer 120b is formed by an inkjet method.

The touch electrode 131 may be formed on the encapsulation layer 120. In one embodiment of the present disclosure, the touch electrode 131 may be directly formed on the third encapsulation layer 120c. In another exemplary embodiment of the present disclosure, a touch buffer layer (not illustrated) may be further formed between the touch electrode 131 and the third encapsulation layer 120c.

A plurality of touch electrodes 131 may be formed. Specifically, each of the plurality of touch electrodes 131 may be located between adjacent sub pixels. In one exemplary embodiment of the present disclosure, each of the plurality of touch electrodes 131 may be located so as to overlap a flat surface of the bank 107. That is, each of the plurality of touch electrodes 131 may not overlap the emission area.

The touch protection layer 133 may be located on the touch electrode 131. The touch protection layer 133 may protect the touch electrode 131 from components located above the touch electrode 131. The touch protection layer 133 may be formed of an insulating material. The touch protection layer 133 may be formed of an organic material such as resin or an inorganic material such as silicon oxide, but is not limited thereto.

The light shielding pattern 140 may be located on the touch protection layer 133. The light shielding pattern 140 is formed of a black material to absorb light incident onto the light shielding pattern 140. In the exemplary embodiment of the present disclosure, the light shielding pattern 140 may be formed to overlap the touch electrode 131. Specifically, the light shielding pattern 140 may completely cover the touch electrode 131. In other words, the touch electrode 131 may completely overlap the light shielding pattern 140. That is, a width of a cross-section of the light shielding pattern 140 may be greater than a width of a cross-section of the touch electrode 131. Accordingly, the touch electrode 131 is not visibly recognized from the outside of the organic light emitting diode and the degradation of the aperture ratio due to the touch electrode 131 may also be suppressed.

A plurality of light shielding patterns 140 may be formed. Specifically, each of the plurality of light shielding patterns 140 may be located between adjacent sub pixels. In one exemplary embodiment of the present disclosure, each of the plurality of light shielding patterns 140 may be located so as to overlap a flat surface of the bank 107. That is, each of the plurality of light shielding patterns 140 may not overlap the emission area.

The light loss inducing layer 150 may be disposed between the plurality of light shielding patterns 140 such that the light loss inducing layer is disposed between a pair of light shielding patterns from the plurality of light loss shielding patterns 140. Specifically, the light loss inducing layer 150 may be formed on a same plane as the plurality of light shielding patterns 140. Thus, both the light loss inducing layer 150 and the plurality of light shielding patterns 140 are on the touch protection layer 133. Further, the light loss inducing layer 150 may overlap the emission area. Further, the light loss inducing layer 150 may overlap the inclined surface of the bank 107.

The light loss inducing layer 150 may be formed of a material with a low refractive index. For example, the light loss inducing layer 150 may be formed of transparent silicon oxide SiOx. A refractive index of the light loss inducing layer 150 according to the exemplary embodiment of the present disclosure may be 1.2 to 1.4. Specifically, the refractive index of the light loss inducing layer 150 may be less than a refractive index of the touch protection layer 133 adjacent there below. Further, the refractive index of the light loss inducing layer 150 may be less than a refractive index of the transmittance control layer 160 adjacent there above. The light loss inducing function of the light loss inducing layer 150 will be described below.

The transmittance control layer 160 may be located on the light shielding pattern 140 and the light loss inducing layer 150. A lower surface of the transmittance control layer 160 according to the exemplary embodiment of the present disclosure may be in contact with both the light shielding pattern 140 and the light loss inducing layer 150. Specifically, the transmittance control layer 160 may be formed on the entire surface of the substrate 101.

The transmittance control layer 160 may be formed of an insulating material. The transmittance control layer 160 is a component which replaces the circular polarizer of the related art and may be implemented by a film formed of a mixture of a transparent resin and a gray pigment. Here, the transparent resin may be formed of one or more resins selected from a group comprising of polyester, acrylic, polyurethane, melamine, polyvinyl alcohol, or oxazoline binder resins, and desirably, formed of an acrylic binder resin. A refractive index of the transmittance control layer 160 may be 1.6.

The cover layer 170 may be located on the transmittance control layer 160. The cover layer 170 is formed on the entire surface of the substrate 101 to protect the components below the cover layer 170 from the external impact. The cover layer 170 may be formed of tempered glass or transparent plastic. A refractive index of the cover layer 170 may be 1.5. An air layer (not illustrated) may be located on the cover layer 170 and a refractive index of the air layer may be 1.0.

The transmittance of the transmittance control layer 160 may be set by adjusting a thickness of the transmittance control layer 160 or a concentration of a gray pigment included in the transmittance control layer 160. At this time, when the transmittance of the transmittance control layer 160 is set to be high, a lot of generated light B is emitted to the outside so that the optical efficiency is increased. However, simultaneously, reflected light A which is incident from the outside to be reflected by the anode 105 is also emitted to the outside a lot so that the visibility of the image displayed in the organic light emitting diode is reduced. In contrast, when the transmittance of the transmittance control layer 160 is set to be low, less generated light B is emitted to the outside so that the optical efficiency is reduced. However, simultaneously, reflected light A which is incident from the outside to be reflected by the anode 105 is also less emitted to the outside so that the visibility of the image displayed in the organic light emitting diode is improved. That is, the transmittance of the transmittance control layer 160 and the image visibility of the organic light emitting diode have a trade-off relationship. Accordingly, it is difficult to satisfy both the optical efficiency and the image visibility of the organic light emitting diode by appropriately setting the transmittance of the transmittance control layer 160.

Accordingly, the organic light emitting diode according to the exemplary embodiment of the present disclosure includes the light loss inducing layer 150 to suppress emission of the reflected light A while reducing the loss of the generated light B.

The reflected light A is external light which is reflected by the anode 105 to be emitted to the outside again. The reflected light A is substantially Lambertian-reflected on a surface of the anode 105. That is, the external light incident onto the surface of the anode 105 is substantially uniformly diffused from the surface of the anode 105 in all directions to be emitted to the outside again. Accordingly, the reflected light A has a uniform amount of light regardless of the viewing angle. In FIG. 2, an amount of reflected light A is illustrated with a thickness of an arrow indicating the reflected light A and it may be confirmed that the thickness of the arrow indicating the reflected light A is same regardless of the viewing angle.

When the reflected light A is reflected from the surface of the anode 105, etc. and then emitted to the outside again, the reflected light meets the light loss inducing layer 150. A refractive index of the light loss inducing layer 150 is less than a refractive index of the touch protection layer 133 there below so that the reflected light A is refracted toward the light shielding pattern 140 at an interface of the light loss inducing layer 150 and the touch protection layer 133. Therefore, not only is the reflected light A which is directly incident onto the light shielding pattern 140, but the reflected light A which is incident onto the light loss inducing layer 150 adjacent to the light shielding pattern 140 is absorbed by the light shielding pattern 140. That is, an amount of reflected light A which is emitted to the outside is reduced to a predetermined level by the light shielding pattern 140 and the light loss inducing layer 150.

The generated light B also meets the light loss inducing layer 150 when the generated light B is generated in the organic light emitting layer 109 and then emitted to the outside. A refractive index of the light loss inducing layer 150 is less than a refractive index of the touch protection layer 133 there below so that the generated light B is refracted toward the light shielding pattern 140 at an interface of the light loss inducing layer 150 and the touch protection layer 133. Therefore, not only is the generated light B which is directly incident onto the light shielding pattern 140, but also generated light B which is incident onto the light loss inducing layer 150 adjacent to the light shielding pattern 140 is also absorbed by the light shielding pattern 140.

However, as described above, an amount of generated light B may vary depending on a viewing angle, unlike the reflected light A. In FIG. 2, an amount of generated light B is illustrated with a thickness of an arrow indicating the generated light B and it is confirmed that the thickness of the arrow indicating the generated light B varies depending on the viewing angle. Therefore, a large amount of the generated light B is emitted to the front of the organic light emitting diode and the amount of emitted light is reduced toward the side surface of the organic light emitting diode.

Accordingly, an amount of generated light B which is directly incident onto the light shielding pattern 140 and generated light B which is incident onto the light loss inducing layer 150 adjacent to the light shielding pattern 140 and then incident onto the light shielding pattern 140 may be much smaller than an amount of generated light B which is not incident onto the light shielding pattern 140. That is, an amount of generated light B absorbed by the light shielding pattern 140 may be insignificant as compared with the amount of overall generated light B.

As described above, it is assumed that an amount of reflected light A immediately after being reflected from the anode 105, etc. is equal to an amount of generated light B immediately after being generated in the organic light emitting layer 109. Under this assumption, an amount of reflected light A which is incident onto the light shielding pattern 140 by the light loss inducing layer 150 may be larger than an amount of generated light B which is incident onto the light shielding pattern 140 by the light loss inducing layer 150. That is, the emission of the reflected light A may be suppressed by the light loss inducing layer 150 while reducing the loss of the generated light B.

At this time, a lost amount of the generated light B and a shielded amount of the reflected light A may be set by adjusting a distance (hereinafter, distance D) between an edge of the emission area and a side surface of the light shielding pattern 140 adjacent to the edge of the emission area. This will be described in detail with reference to FIGS. 3 and 4.

Figure 3:
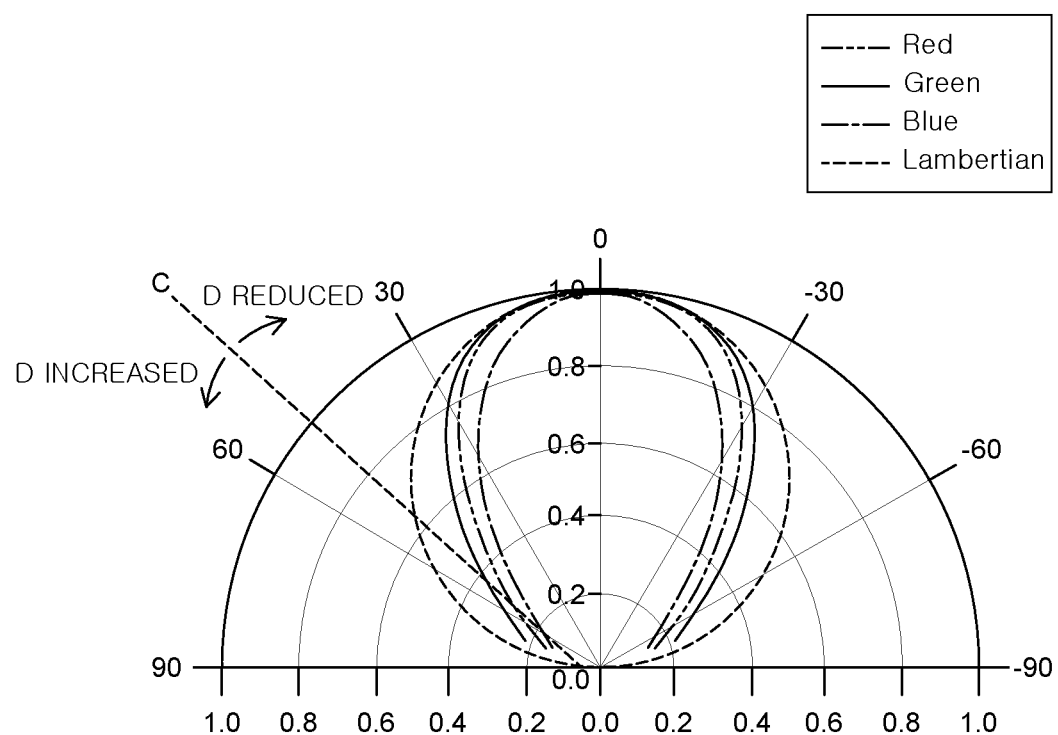
FIG. 3 is a graph illustrating a light distribution of reflected light and generated light of FIG. 2 at different angles.
Figure 4:
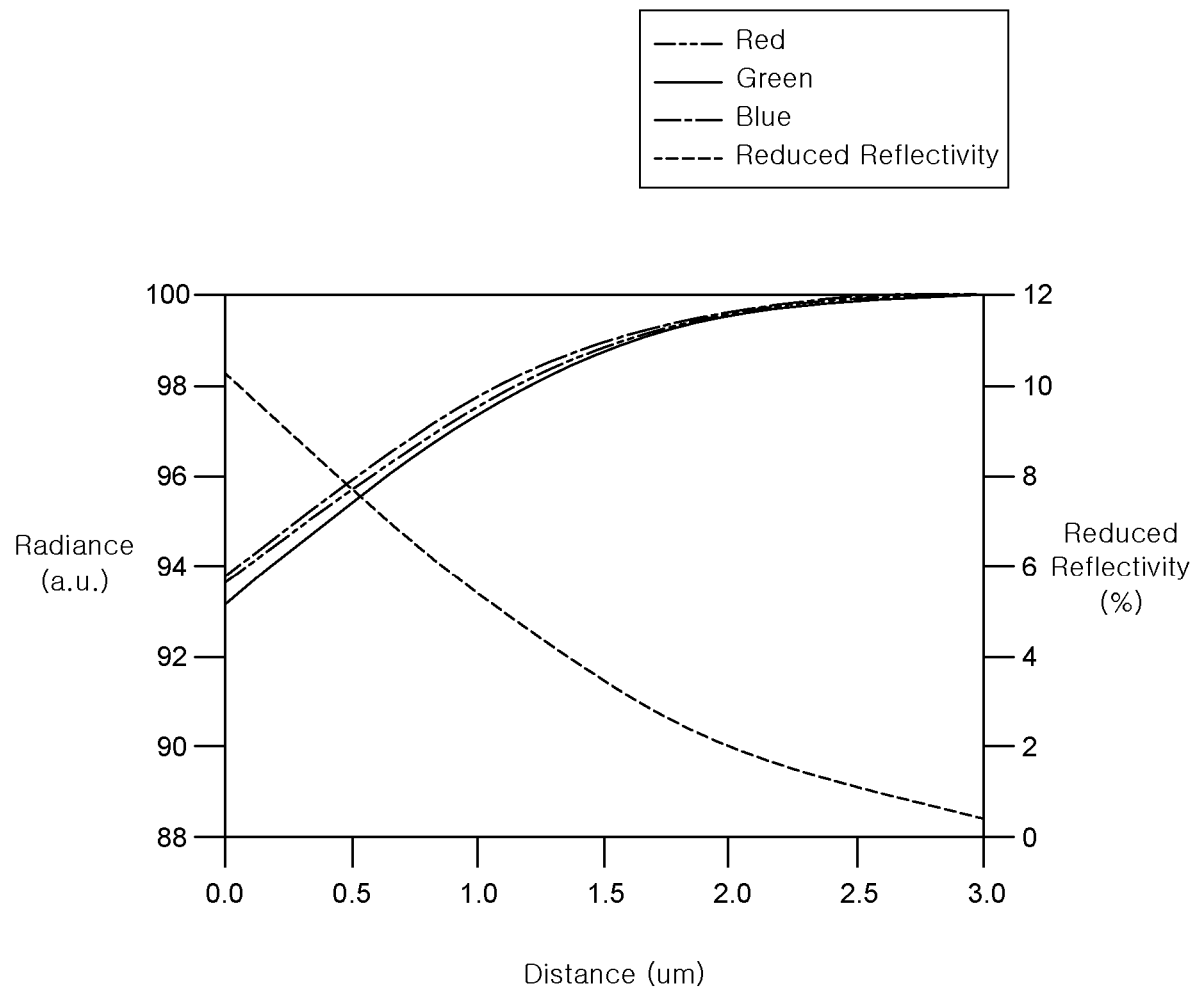
FIG. 4 is a graph illustrating a change in an amount of generated light and a change in reflectivity reduction effect according to change of distance D of FIG. 2.

FIG. 3 is a graph illustrating a light distribution of reflected light A and generated light B of FIG. 2 at every angle. FIG. 4 is a graph illustrating a change in an amount of generated light B and a change in reflectivity reduction effect according to change of the distance D of FIG. 2. In FIGS. 3 and 4, the refractive index of the light loss inducing layer 150 is 1.3.

In FIG. 3, a horizontal axis and a vertical axis indicate relative light intensity and a number represented on a circumference of the outermost semi-circle indicates an angle (viewing angle). Here, angle 0 refers to a direction perpendicular to a surface of the anode 105 and angles 90 and −90 refers to a direction parallel to the surface of the anode 105. Red, green, and blue represent generated light B emitted from red, green, and blue sub pixels RP, GP, and BP, respectively and Lambertian represents reflected light A reflected from the anode 105, etc.

Light which is absorbed by the light shielding pattern 140 of FIG. 2, but is not emitted to the outside is light below a dotted straight line (hereinafter, a straight line C) of FIG. 3. As seen from the intensity of the generated light B and the reflected light A which are in contact with the straight line C of FIG. 3, a shielded amount of the reflected light A is relatively larger than a lost amount of the generated light B by the light shielding pattern 140. The lost amount of the generated light B and the shielded amount of the reflected light A may be set to a desired value by adjusting the distance D. For example, when the distance D is increased, the straight line C of FIG. 3 is downwardly tilted so that both the lost amount of the generated light B and the shielded amount of the reflected light A are reduced. As another example, when the distance D is reduced, the straight line C of FIG. 3 is upwardly tilted so that both the lost amount of the generated light B and the shielded amount of the reflected light A are increased.

However, the lost amount of the generated light B and the shielded amount of the reflected light A according to the distance D are not the same. A horizontal axis of FIG. 4 represents a change of the distance D, a left vertical axis represents an intensity of the generated light B, and a right vertical axis represents a reflectivity reduction effect of the reflected light A. Red, green, and blue represent generated light B emitted from red, green, and blue sub pixels RP, GP, and BP, respectively and Reduced Reflectivity represents the reflectivity reduction effect of the reflected light A.

As seen in FIG. 4, the smaller the distance D, the larger the lost amount of the generated light B and the shielded amount of the reflected light A. However, the amount of reflected light A shielded when the distance D is reduced by a predetermined level is larger than the amount of generated light B lost when the distance D is reduced by a predetermined level. That is, the reflectivity reduction effect of the reflected light A which can be obtained by reducing the distance D is larger than the loss of the generated light B.

The experiment result of FIG. 4 is represented in the following Table 1.

TABLE 1

| Distance D | Amount of emitted light (x) | | | Reflectivity reduction effect (y) |
| --- | --- | --- | --- | --- |
| | R | G | B | |
| 0 μm | 93.6 | 93.2 | 93.7 | 10.2 |
| 1 μm | 97.5 | 97.4 | 97.7 | 5.4 |
| 2 μm | 99.6 | 99.5 | 99.6 | 2.0 |
| 3 μm | 100.0 | 100.0 | 100.0 | 0.4 |

When x+y<100, there is no effect of suppressing the emission of the reflected light A while reducing the loss of the generated light B and when x+y>100, the emission of the reflected light A may be suppressed while reducing the emission of the reflected light A. As seen from Table 1, when the distance D is 0 μm to 3 μm, x+y>100 so that it is possible to suppress the emission of the reflected light A while reducing the loss of the generated light B.

In the exemplary embodiment of the present disclosure, the distance D may be 3 μm or less. In this case, a reflectivity reduction effect of the reflected light A may be 0.4% without losing the generated light B.

In another exemplary embodiment of the present disclosure, the distance D may be 0 μm. In this case, an end portion of the emission area and a side surface of the light shielding pattern 140 adjacent to the end portion of the emission area are located on the same plane. At this time, approximately 6 to 7 AU of generated light B is lost, but the reflectivity reduction effect of the reflected light A is 10.2% so that in the organic light emitting diode which is frequently exposed to the external light, the distance D may be set to 0 μm.

Figure 5:
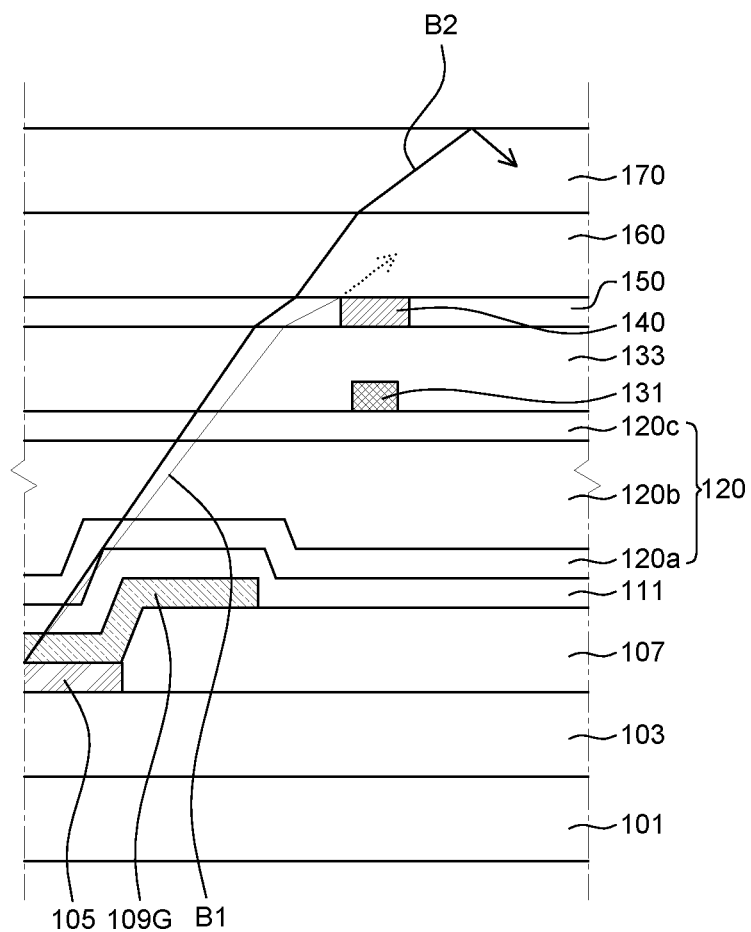
FIG. 5 is a cross-sectional view illustrating a path of generated light of FIG. 2 according to the first exemplary embodiment of the present disclosure.
Figure 6:
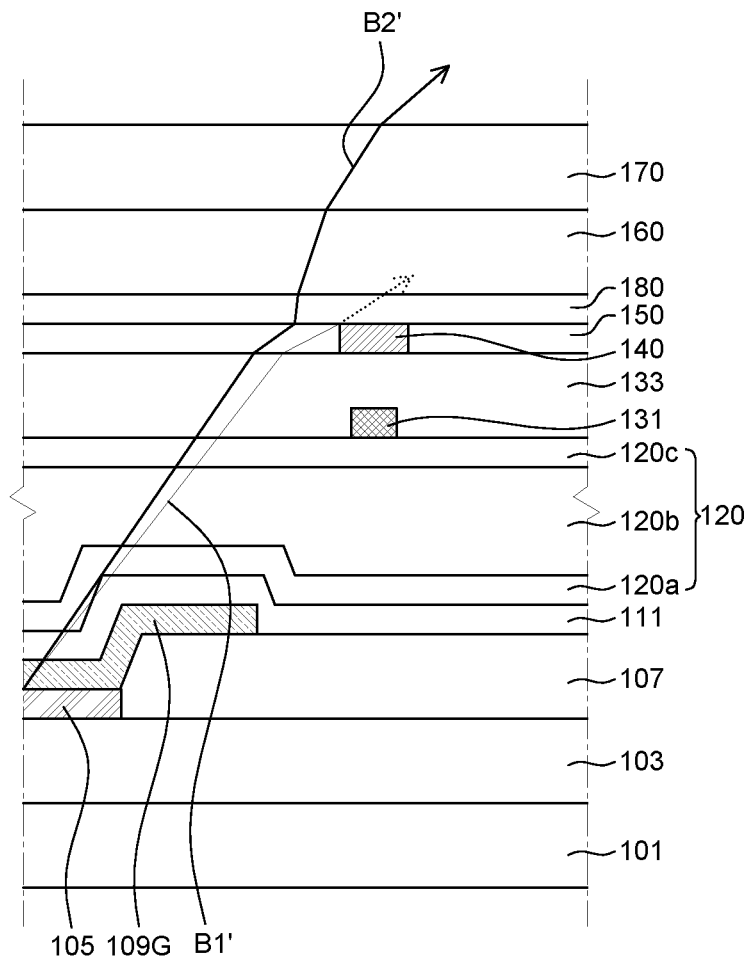
FIG. 6 is a cross-sectional view illustrating a path of generated light according to a second exemplary embodiment of the present disclosure.

Next, a second exemplary embodiment of the present disclosure will be described. FIG. 5 is a cross-sectional view illustrating a path of generated light B of FIG. 2. FIG. 6 is a cross-sectional view illustrating a path of generated light B' according to another exemplary embodiment of the present disclosure.

First, referring to FIG. 5, in an organic light emitting diode according to the first exemplary embodiment of the present disclosure, a part (hereinafter, generated light B1) of generated light B which is incident onto the light loss inducing layer 150 adjacent to the light shielding pattern 140 is refracted in a direction parallel to the substrate 101 at an interface of the light loss inducing layer 150 and the touch protection layer 133 to be absorbed by the light shielding pattern 140. However, in the first exemplary embodiment of the present disclosure, the other part (hereinafter, generated light B2) of the generated light B which is incident onto the light loss inducing layer 150 adjacent to the light shielding pattern 140 is refracted in a direction parallel to the substrate 101 at an interface of the light loss inducing layer 150 and the touch protection layer 133. However, the generated light B2 is not absorbed by the light shielding pattern 140, but may be emitted above the light shielding pattern 140. However, the generated light B2 is refracted in a direction parallel to the substrate 101 at an interface of the light loss inducing layer 150 and the touch protection layer 133 so that the generated light B2 is highly likely to be total-reflected at the interface of the cover layer 170 and the air layer (not illustrated). That is, the generated light B2 which needs to be emitted to the outside to be visibly recognized by the user of the organic light emitting diode is inwardly reflected from an upper surface of the cover layer 170 so that light loss may be caused.

In order to solve this problem, as illustrated in FIG. 6, a light emission inducing layer 180 may be further located on the light shielding pattern 140 and the light loss inducing layer 150. The light emission inducing layer 180 may be formed on the entire surface of the substrate 101. Specifically, the light emission inducing layer 180 may be in contact with an upper surface of the light shielding pattern 140 and an upper surface of the light loss inducing layer 150 and may be in contact with a lower surface of the transmittance control layer 160. Thus, the light emission inducting layer 180 is between the transmittance control layer 160 and the light shielding pattern 140 and light loss inducing layer 150.

The light emission inducing layer 180 may be formed of a material with a high refractive index. For example, the light emission inducing layer 180 may be formed of transparent nitrogen oxide SiNx. A refractive index of the light emission inducing layer 180 according to the exemplary embodiment of the present disclosure may be 1.7 to 1.9. Specifically, the refractive index of the light emission inducing layer 180 may be greater than a refractive index of the light loss inducing layer 150 adjacent there below. Further, the refractive index of the light emission inducing layer 180 may be greater than a refractive index of the transmittance control layer 160 adjacent there above.

As described above, when the light emission inducing layer 180 is located on the light loss inducing layer 150, the generated light B2' having the same path as the generated light B2 of FIG. 5 below the light loss inducing layer 150 is reflected in a direction perpendicular to the substrate 101 at the interface between the light loss inducing layer 150 and the light emission inducing layer 180. Therefore, the generated light B2' is highly likely to be emitted to the outside without being total-reflected from the upper surface of the cover layer 170. That is, the light emission inducing layer 180 is additionally disposed to increase an amount emitted to the outside while suppressing the total reflection of the light generated in the organic light emitting layer 109.

Figure 7:
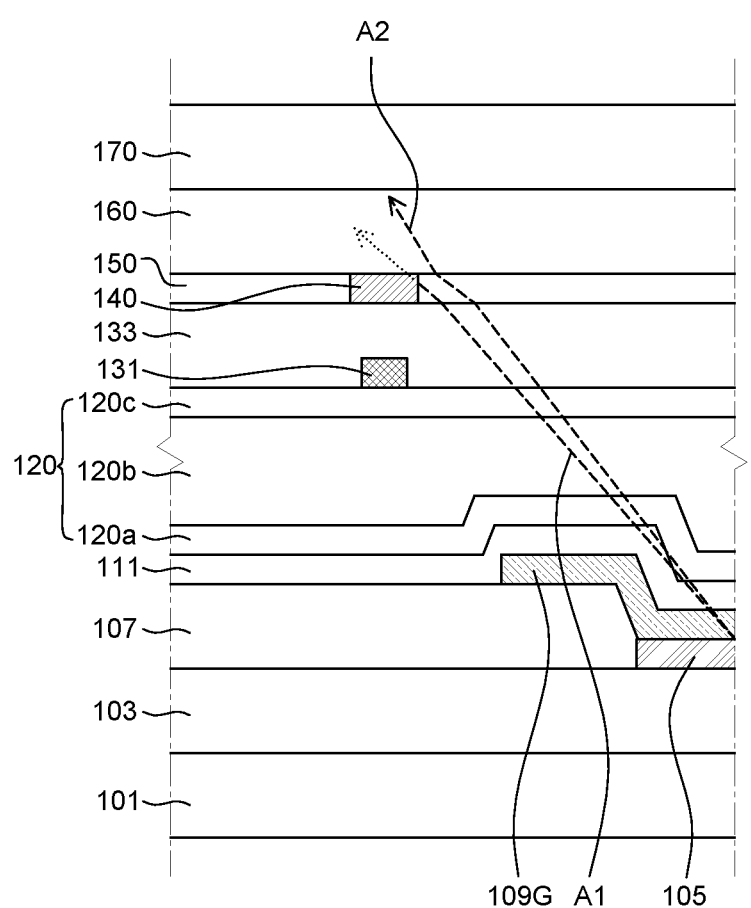
FIG. 7 is a cross-sectional view illustrating a path of reflected light of FIG. 2 according to the first exemplary embodiment of the present disclosure.
Figure 8:
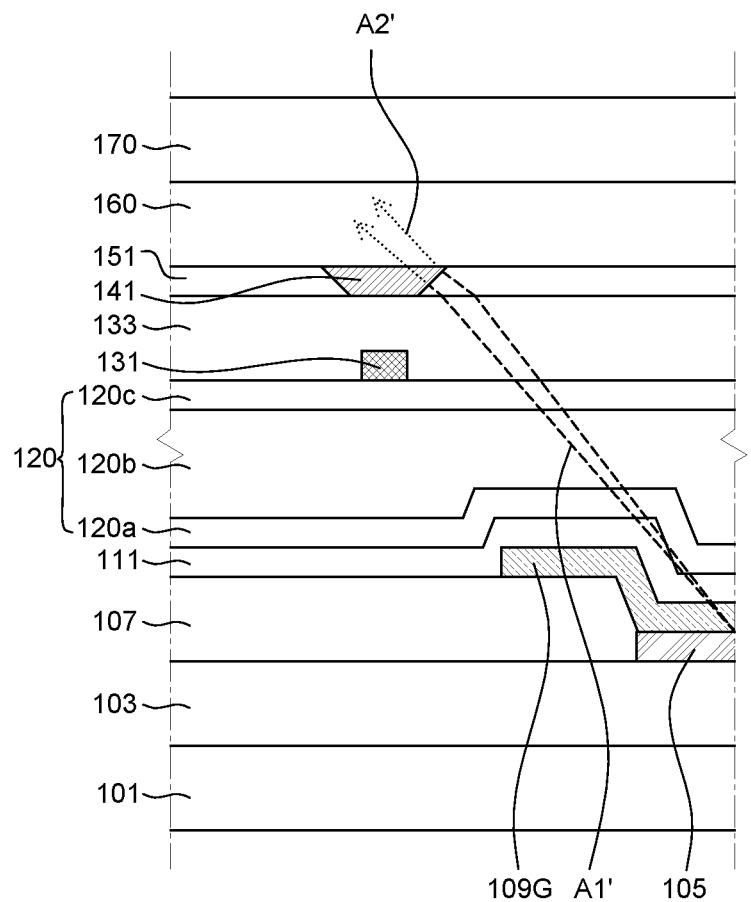
FIG. 8 is a cross-sectional view illustrating a path of reflected light according to a third exemplary embodiment of the present disclosure.

Next, a third exemplary embodiment of the present disclosure will be described. FIG. 7 is a cross-sectional view illustrating a path of reflected light A of FIG. 2. FIG. 8 is a cross-sectional view illustrating a path of reflected light A' according to a third exemplary embodiment of the present disclosure.

First, referring to FIG. 7, in an organic light emitting diode according to the first exemplary embodiment of the present disclosure, a part (hereinafter, reflected light A1) of reflected light A1 which is incident onto the light loss inducing layer 150 adjacent to the light shielding pattern 140 is refracted in a direction parallel to the substrate 101 at an interface of the light loss inducing layer 150 and the touch protection layer 133 to be absorbed by the light shielding pattern 140. However, in the first exemplary embodiment of the present disclosure, the other part (hereinafter, reflected light A2) of the reflected light A2 which is incident onto the light loss inducing layer 150 adjacent to the light shielding pattern 140 is refracted in a direction parallel to the substrate 101 at an interface of the light loss inducing layer 150 and the touch protection layer 133. However, the generated light B2 is not absorbed by the light shielding pattern 140, but may be emitted above the light shielding pattern 140.

The organic light emitting diode according to the third exemplary embodiment of the present disclosure may form the light shielding pattern 141 to have a reverse tapered cross-sectional shape as illustrated in FIG. 8 to suppress the external emission not only of the reflected light A1 of FIG. 1, but also the reflected light A2. Further, the light loss inducing layer 151 may be formed to have a normal tapered cross-sectional shape. That is, in the organic light emitting diode according to the third exemplary embodiment of the present disclosure, the reverse tapered side surface of the light shielding pattern 141 is located on an emission path of the reflected light A2 to block more amount of reflected light A'.

Figure 9:
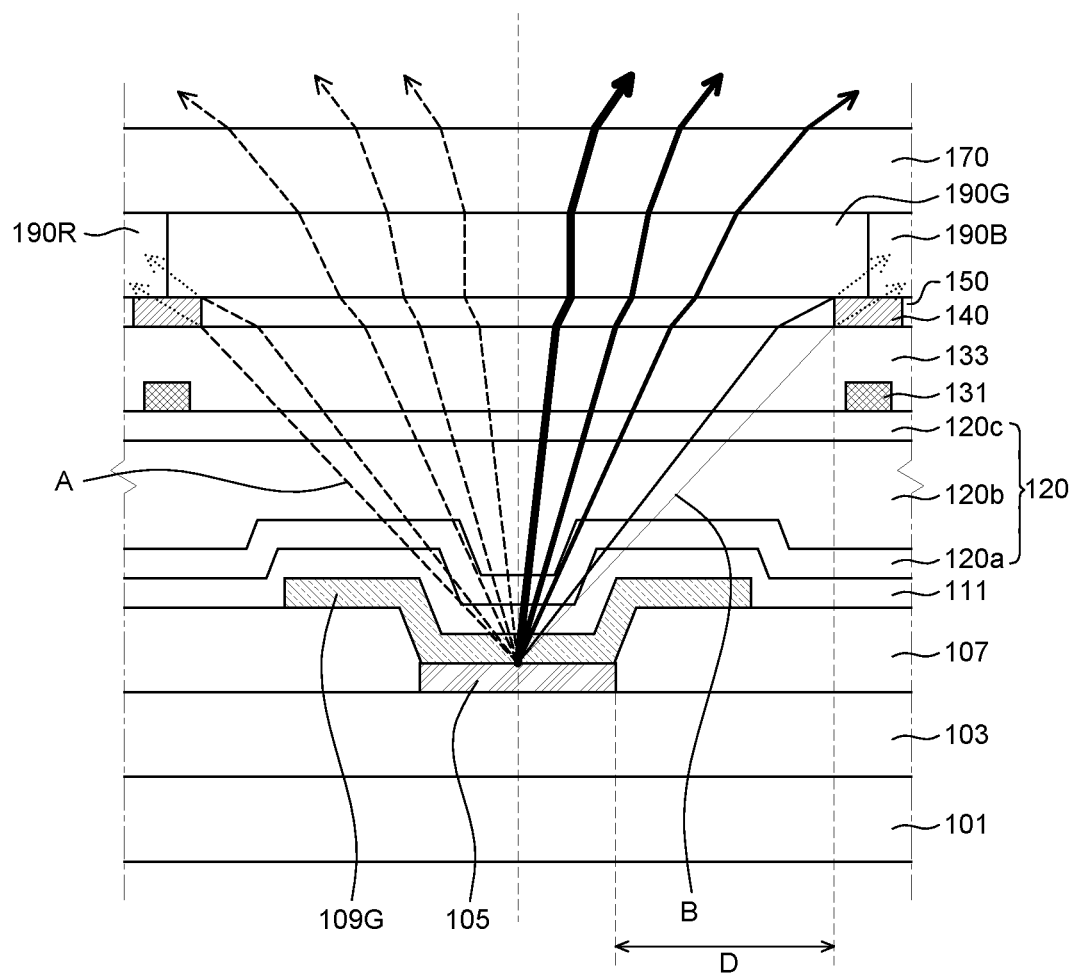
FIG. 9 is a cross-sectional view of a green sub pixel part according to a fourth exemplary embodiment of the present disclosure.

Next, a fourth exemplary embodiment of the present disclosure will be described. FIG. 9 is a cross-sectional view of a green sub pixel part according to a fourth exemplary embodiment of the present disclosure.

Referring to FIG. 9, a color filter layer 190 may be located instead of the transmittance control layer 160 of FIG. 2. The color filter layer 190 may include a red color filter 190R, a green color filter 190G, and a blue color filter 190B formed of an insulating material, but is not limited thereto. The color filter layer 190 increases color purity of the generated light B emitted from the organic light emitting layer 109 and reduces the external emission of the reflected light A, like the transmittance control layer 160. A refractive index of the color filter layer 190 may be 1.5 to 1.6 and is higher than a refractive index of the light loss inducing layer 150. That is, similarly to the first exemplary embodiment of the present disclosure, the refractive index of the light loss inducing layer 150 is lower than a refractive index of insulating layers located there above and there below so that light incident onto the light loss inducing layer 150 is refracted to a direction parallel to the substrate 101. Accordingly, light incident onto the light loss inducing layer 150 adjacent to the light shielding pattern 140 is incident onto the light shielding pattern 140 to be absorbed by the light shielding pattern 140.

Next, a manufacturing method of an organic light emitting diode according to the first exemplary embodiment of the present disclosure will be described with reference to FIGS. 10 to 14.

Figure 10:
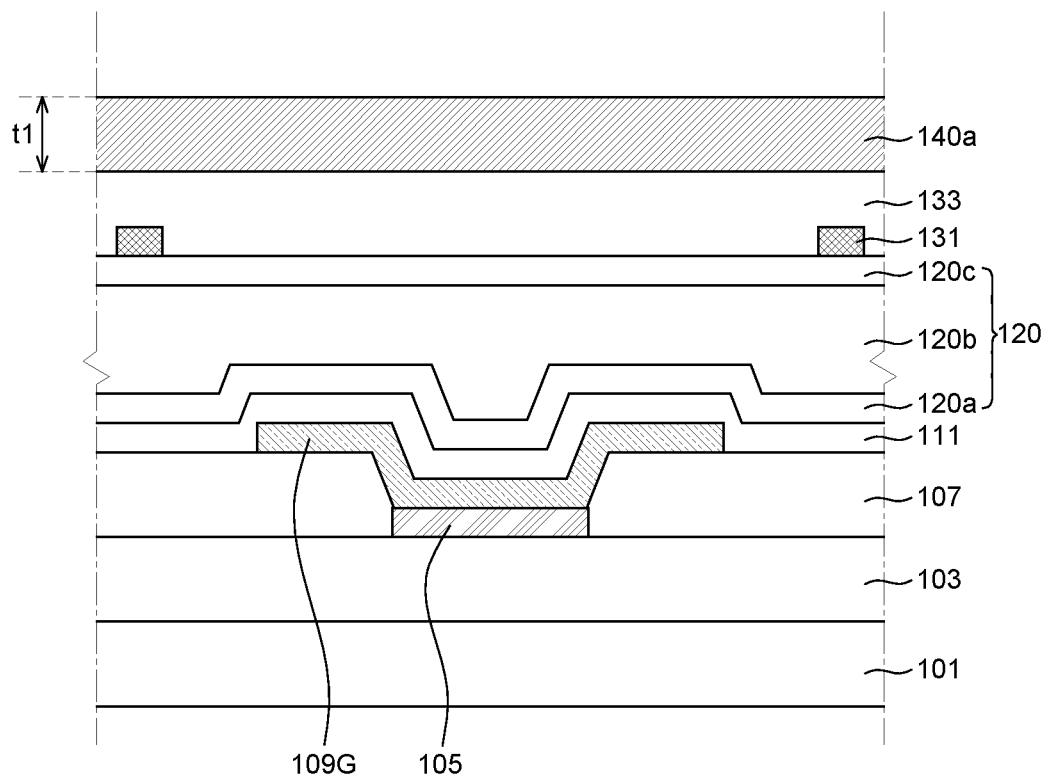
FIGS. 10 to 14 are cross-sectional views illustrating a manufacturing method of an organic light emitting diode according to the first exemplary embodiment of the present disclosure.

First, referring to FIG. 10, the substrate 101, the TFT layer 103, the anode 105, the bank 107, the organic light emitting layer 109, the cathode 111, the encapsulation layer 120, the touch electrode 131, and the touch protection layer 133 are sequentially laminated. Thereafter, a photo-sensitive light shielding material 140a is coated on the entire touch protection layer 133 to have a first thickness t1. Here, the photo-sensitive light shielding material 140a may be a black material having a positive-photoresist characteristic.

Figure 11:
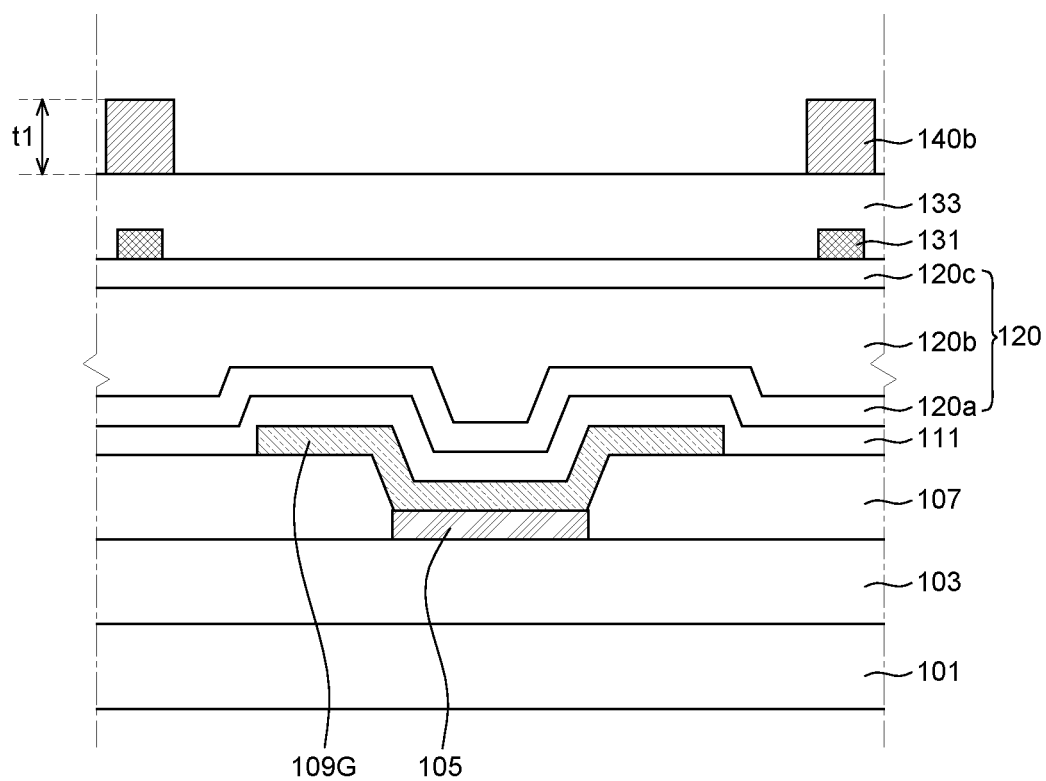

Next, referring to FIG. 11, a fully coated photo-sensitive light shielding material 140a is partially exposed and developed to form a patterned photo-sensitive light shielding material 140b in an area overlapping the touch electrode 131. At this time, a thickness of the patterned photo-sensitive light shielding material 140b may be the first thickness t1 as it is.

Figure 12:
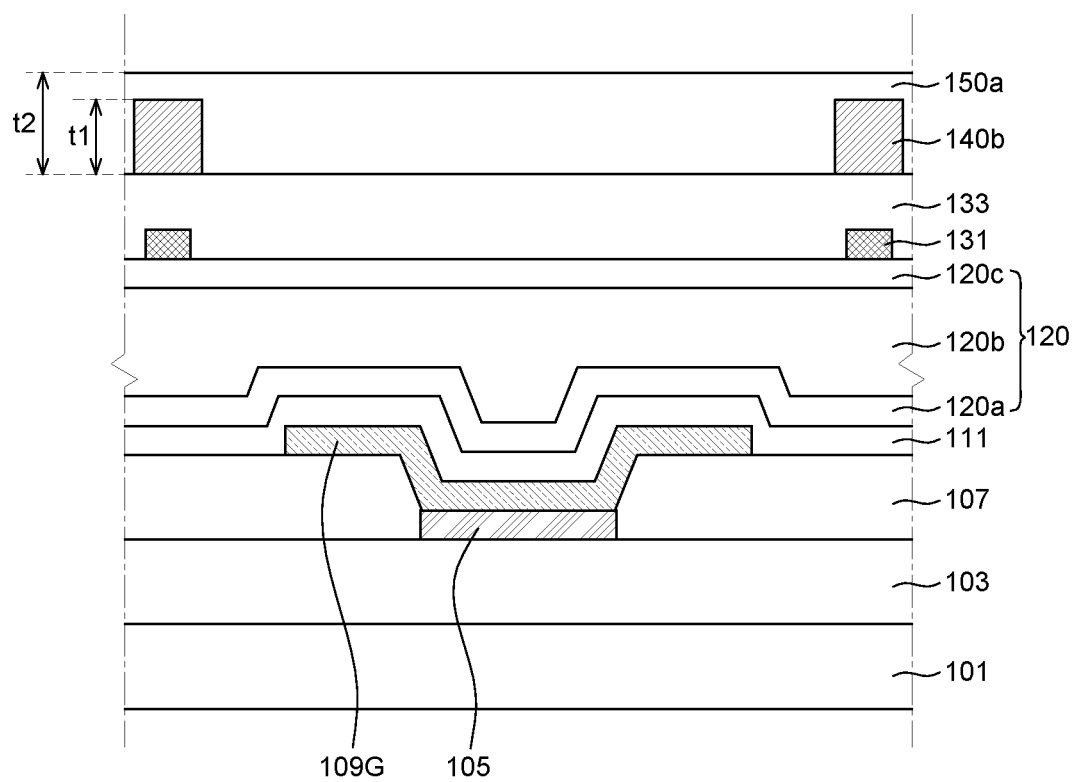

Next, referring to FIG. 12, a photo-sensitive light loss inducing material 150a is coated on the entire patterned photo-sensitive light shielding material 140b to have a second thickness t2. Here, the photo-sensitive light loss inducing material 150a may also be a transparent material having a positive photo-resist characteristic. A refractive index of the photo-sensitive light loss inducing material 150a may be 1.2 to 1.4. In this case, the second thickness t2 may be larger than the first thickness t1. Accordingly, the photo-sensitive light loss inducing material 150a may completely cover the patterned photo-sensitive light shielding material 140b.

Figure 13:
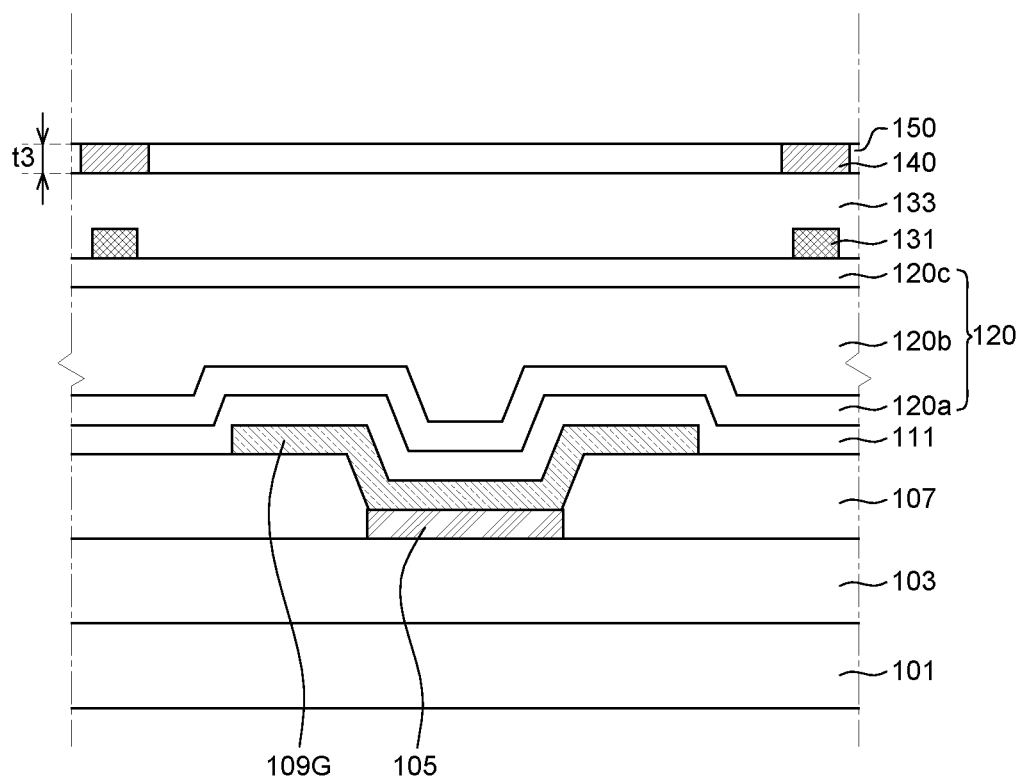

Next, when the full exposure and development are performed as illustrated in FIG. 13, the patterned photo-sensitive light shielding material 140b and the photo-sensitive light loss inducing material 150a may be simultaneously patterned. Specifically, an upper portion of the photo-sensitive light loss inducing material 150a and an upper portion of the patterned photo-sensitive light shielding material 140b are simultaneously removed by a developer used for the development. By doing this, the light shielding pattern 140 and the light loss inducing layer 150 having a third thickness t3 which is smaller than the first thickness t1 may be simultaneously formed.

Figure 14:
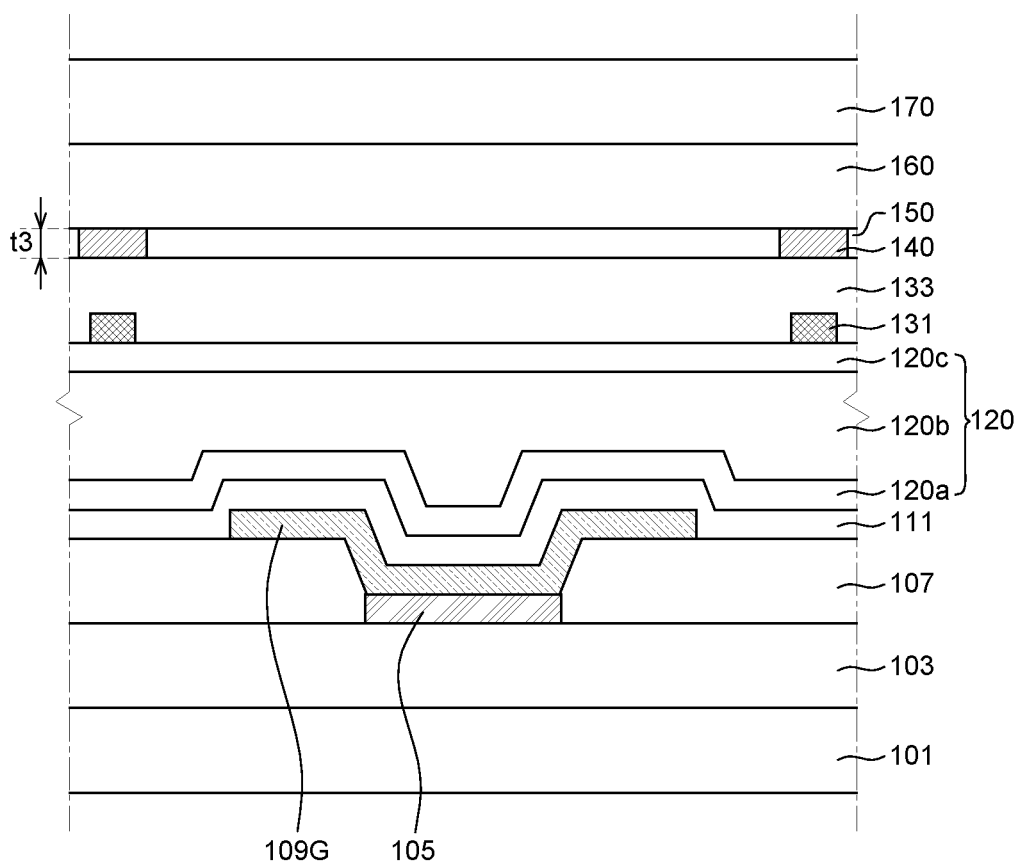

Next, as illustrated in FIG. 14, a transmittance control layer 160 and a cover layer 170 may be sequentially formed on the light shielding pattern 140 and the light loss inducing layer 150.

As described above, the light shielding pattern 140 and the light loss inducing layer 150 are simultaneously formed only using the exposure and development processes without using an etching process. Accordingly, particles caused by the etching process are suppressed and thickness adjustment and alignment of the light shielding pattern 140 and the light loss inducing layer 150 may be easily performed.

Next, a manufacturing method of an organic light emitting diode according to the third exemplary embodiment of the present disclosure will be described with reference to FIGS. 15 to 19.

Figure 15:
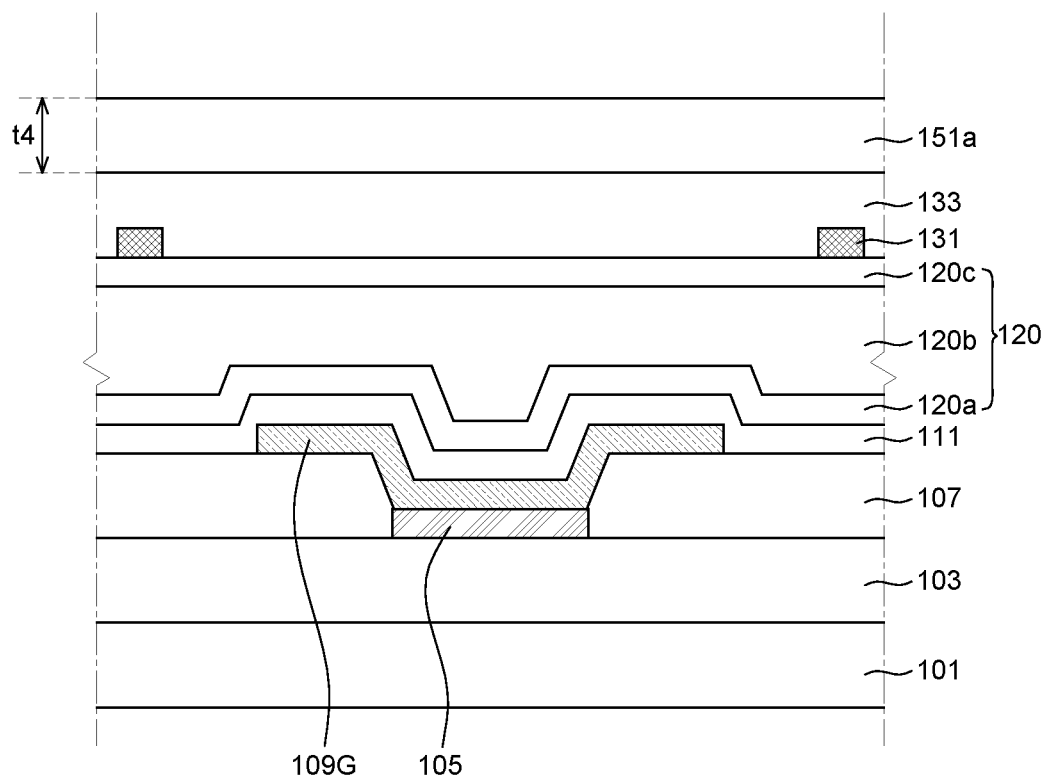
FIGS. 15 to 19 are cross-sectional views illustrating a manufacturing method of an organic light emitting diode according to the third exemplary embodiment of the present disclosure.

First, referring to FIG. 15, the substrate 101, the TFT layer 103, the anode 105, the bank 107, the organic light emitting layer 109, the cathode 111, the encapsulation layer 120, the touch electrode 131, and the touch protection layer 133 are sequentially laminated. Thereafter, a photo-sensitive light loss inducing material 151a is coated on the entire touch protection layer 133 to have a fourth thickness t4. Here, the photo-sensitive light loss inducing material 151a may be a transparent material having a positive photo-resist characteristic. A refractive index of the photo-sensitive light loss inducing material 151a may be 1.2 to 1.4.

Figure 16:
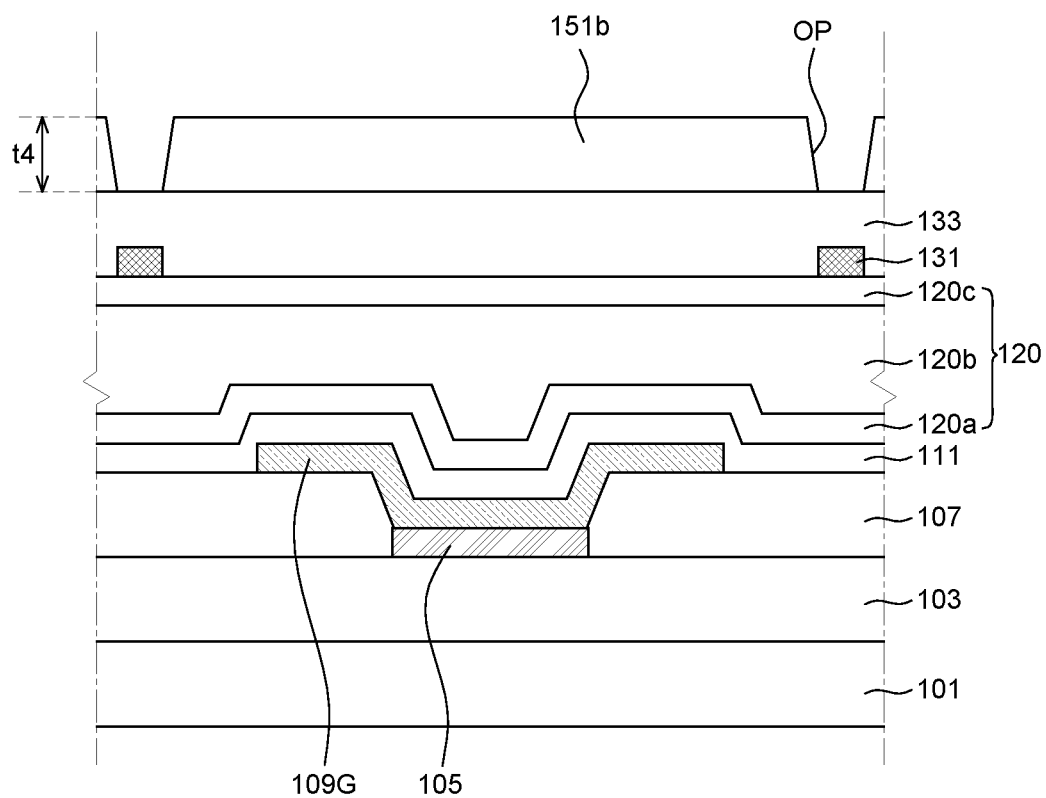

Next, referring to FIG. 16, a fully coated photo-sensitive light loss inducing material 151a is partially exposed and developed to form an opening OP in a location overlapping the touch electrode 131. At this time, a thickness of the photo-sensitive light loss inducing material 151b in which the opening OP is formed may be the fourth thickness t4.

Figure 17:
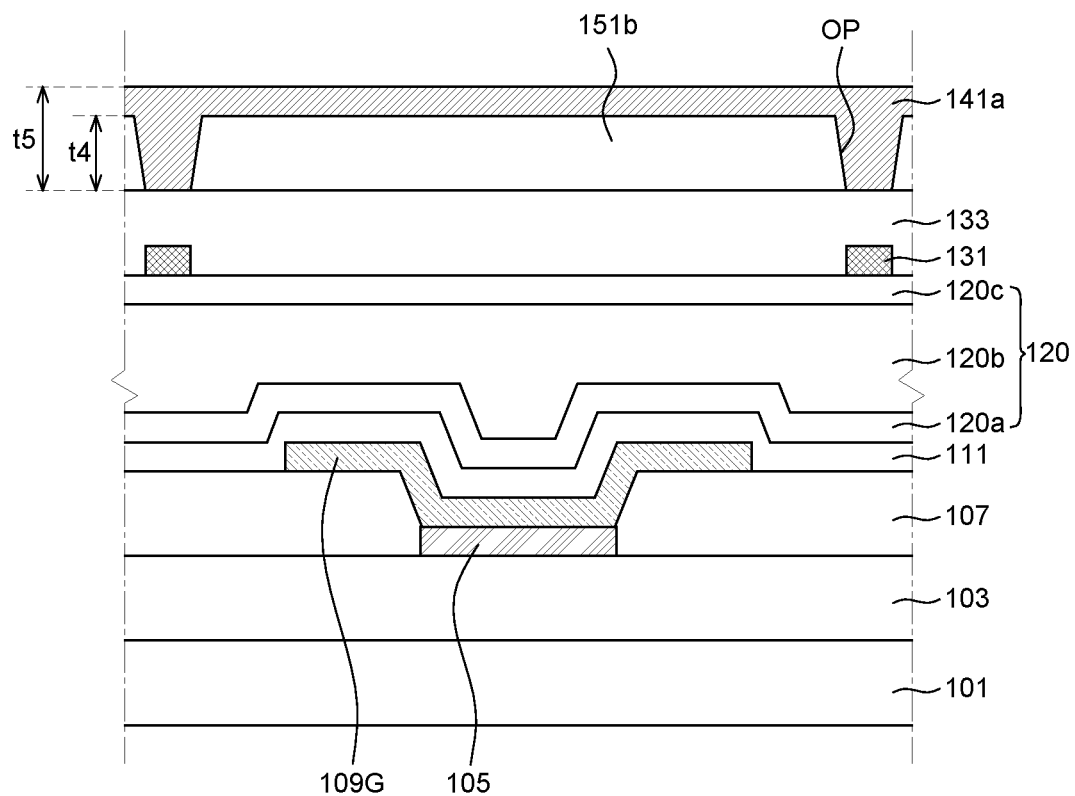

Next, referring to FIG. 17, a photo-sensitive light shielding material 141a is coated on the entire photo-sensitive light loss inducing material 151b in which the opening OP is formed to have a fifth thickness t5. At this time, the fifth thickness t5 is larger than the fourth thickness t4 so that the opening OP is filled with the photo-sensitive light shielding material 141a. Such a photo-sensitive light shielding material 141a may be a black material having a positive-photoresist characteristic.

Figure 18:
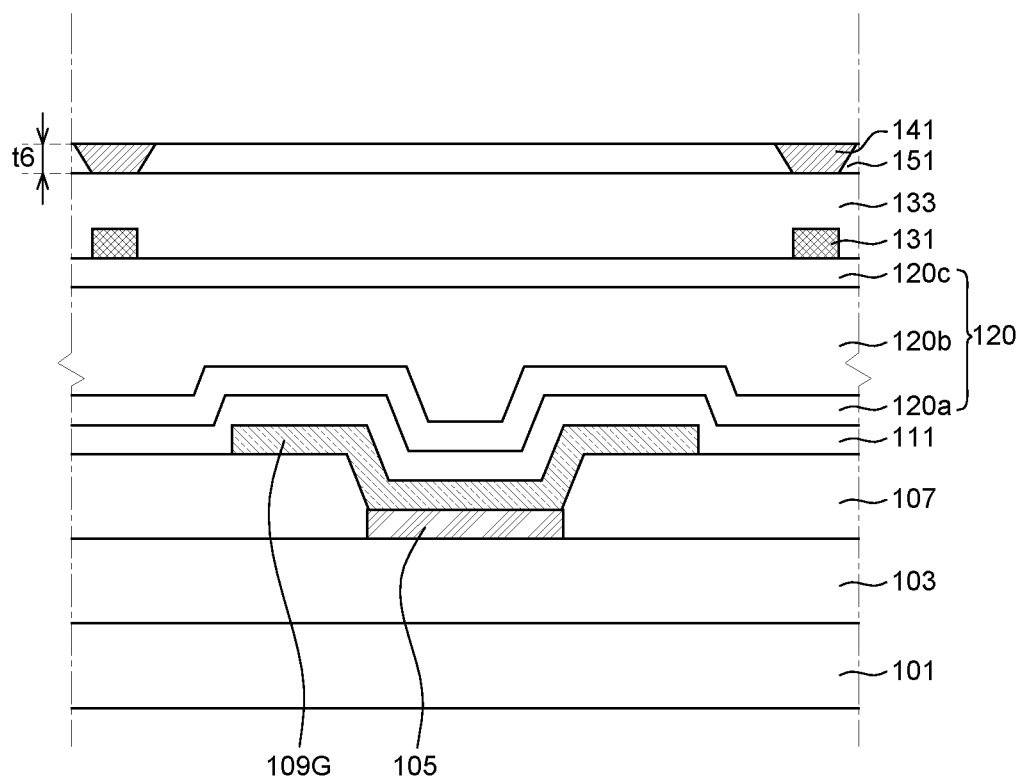

Next, when the full exposure and development are performed as illustrated in FIG. 18, the photo-sensitive light loss inducing material 151b in which the opening OP is formed and the photo-sensitive light shielding material 141a may be simultaneously patterned. Specifically, an upper portion of the photo-sensitive light loss inducing material 151b in which the opening OP is formed and an upper portion of the photo-sensitive light shielding material 141b are simultaneously removed by a developer used for the development. By doing this, the light shielding pattern 141 and the light loss inducing layer 151 having a sixth thickness t6 which is smaller than the fourth thickness t4 may be simultaneously formed. Here, a side cross-section of the light shielding pattern 141 has a reverse tapered shape and a side cross-section of the light loss inducing layer 151 has a normal tapered shape corresponding to the side cross-section of the light shielding pattern 141.

Figure 19:
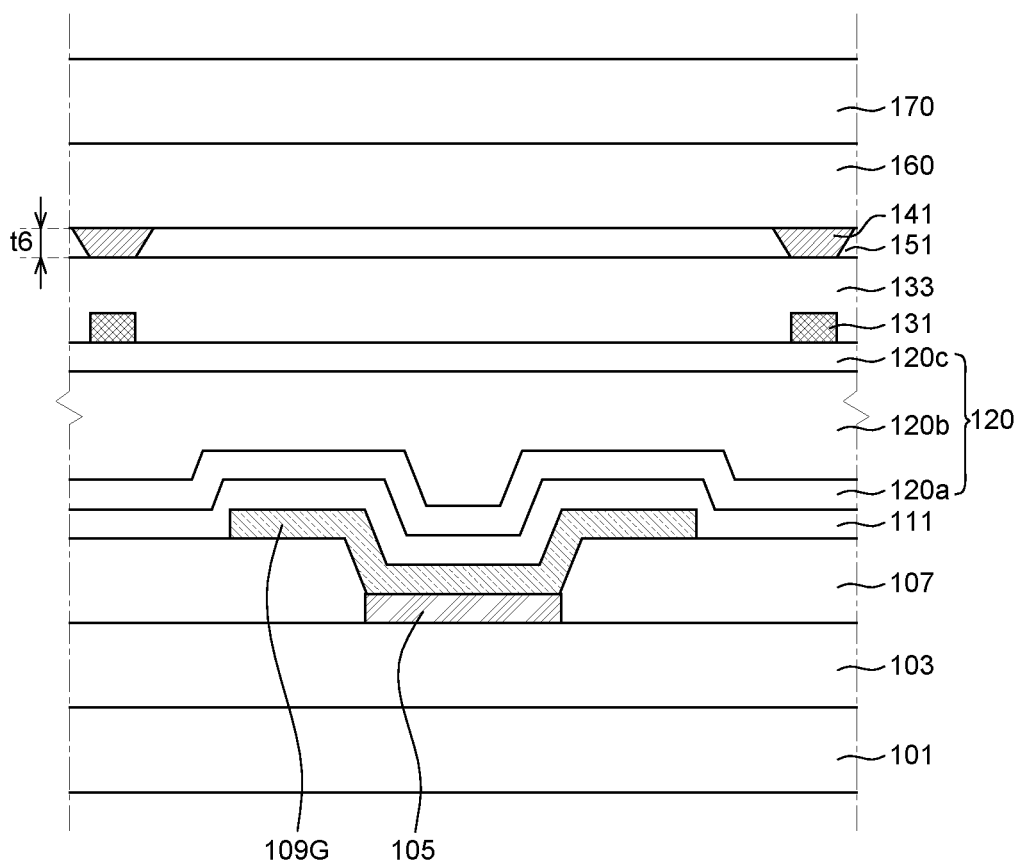

Next, as illustrated in FIG. 19, a transmittance control layer 160 and a cover layer 170 may be sequentially formed on the light shielding pattern 141 and the light loss inducing layer 151.

As described above, the light shielding pattern 141 and the light loss inducing layer 151 are simultaneously formed only using the exposure and development processes without using an etching process. Accordingly, particles caused by the etching process are suppressed and the thickness and the side cross-sectional taper of the light shielding pattern 141 and the light loss inducing layer 151 may be easily adjusted.

As described above, the organic light emitting diodes according to the present disclosure includes the light loss inducing layer 150 located on the organic light emitting layer 109 and the light shielding pattern 140 adjacent to the light loss inducing layer 150. By doing this, it is possible to suppress the external light reflection while reducing loss of light generated in the organic light emitting layer 109.

Further, the organic light emitting diode according to the present disclosure includes the touch electrode 131 overlapping the light shielding pattern 140 to show excellent touch performance without reducing the aperture ratio.

Further, the organic light emitting diode according to the present disclosure includes the transmittance control layer 160 or the color filter layer 190 located so as to correspond to a transmitting direction of light emitted through the organic light emitting layer 109 so that the external light reflection may be suppressed without providing a separate circular polarizer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting diode, comprising:
    a substrate;
    an anode on the substrate;
    a bank on the anode, the bank exposing a part of the anode to define an emission area;
    an organic light emitting layer on the emission area and the bank;
    a cathode on the organic light emitting layer;
    a plurality of light shielding patterns configured to absorb light incident on the plurality of light shielding patterns, the plurality of light shielding patterns on the cathode and overlapping the bank but non-overlapping with the emission area; and
    a light loss inducing layer configured to reduce emission of reflected external light, the light loss inducing layer overlapping the emission area and on a same plane as the plurality of light shielding patterns such that the light loss inducing layer is disposed between a pair of light shielding patterns from the plurality of light shielding patterns, the light loss inducing layer having a same thickness as a thickness of the plurality of light shielding patterns.

2. The organic light emitting diode according to claim 1, wherein the light loss inducing layer overlaps an inclined surface of the bank that is adjacent to the emission area.

3. The organic light emitting diode according to claim 1, wherein a refractive index of the light loss inducing layer is 1.2 to 1.4.

4. The organic light emitting diode according to claim 1, further comprising:
    an encapsulation layer between the cathode and the plurality of light shielding patterns; and
    a plurality of touch electrodes on the encapsulation layer such that the plurality of touch electrodes are between the encapsulation layer and the plurality of light shielding patterns,
    wherein each of the plurality of touch electrodes overlaps a corresponding light shielding pattern from the plurality of light shielding patterns.

5. The organic light emitting diode according to claim 4, further comprising:
    a touch protection layer on the plurality of touch electrodes,
    wherein a refractive index of the light loss inducing layer is less than a refractive index of the touch protection layer.

6. The organic light emitting diode according to claim 4, wherein a width of at least one of the plurality of touch electrodes is less than a width of at least one of the plurality of light shielding patterns.

7. The organic light emitting diode according to claim 1, further comprising:
    a transmittance control layer on the plurality of light shielding patterns and the light loss inducing layer; and
    a cover layer on the transmittance control layer,
    wherein a refractive index of the light loss inducing layer is less than a refractive index of the transmittance control layer.

8. The organic light emitting diode according to claim 7, further comprising:
    a light emission inducing layer between the light loss inducing layer and the transmittance control layer,
    wherein a refractive index of the light emission inducing layer is greater than the refractive index of the light loss inducing layer and the refractive index of the transmittance control layer.

9. The organic light emitting diode according to claim 1, further comprising:
    a color filter layer on the plurality of light shielding patterns and the light loss inducing layer; and
    a cover layer on the color filter layer,
    wherein a refractive index of the light loss inducing layer is less than a refractive index of the color filter layer.

10. The organic light emitting diode according to claim 1, wherein the anode is reflective, the cathode is transflective, and light generated in the organic light emitting layer is emitted toward the cathode.

11. The organic light emitting diode according to claim 1, wherein a distance between an end portion of the emission area and a side surface of a light shielding pattern from the plurality of light shielding patterns that is closest to the end portion of the emission area is less than 3 µm.

12. The organic light emitting diode according to claim 11, wherein the end portion of the emission area and the side surface of the light shielding pattern are located on a same plane.

13. The organic light emitting diode according to claim 1, wherein at least one light shielding pattern of the plurality of light shielding patterns has a reverse tapered cross-sectional shape such that a first surface of the light shielding pattern is wider than a second surface of the light shielding pattern that is overlapped by the first surface, the first surface farther from the substrate than the second surface.

14. An organic light emitting diode, comprising:
    a substrate;
    a plurality of light shielding patterns on the substrate;
    a light loss inducing layer between the plurality of light shielding patterns such that the light loss inducing layer is disposed between a pair of light shielding patterns from the plurality of light shielding patterns;
    a first insulating layer in direct contact with a first surface of the light loss inducing layer; and
    a second insulating layer in direct contact with a second surface of the light loss inducing layer that is farther from the substrate than the first surface of the light loss inducing layer,
    wherein a refractive index of the light loss inducing layer is less than a refractive index of the first insulating layer and less than a refractive index of the second insulating layer.

15. The organic light emitting diode according to claim 14, further comprising:
    a reflective anode between the substrate and the light loss inducing layer, the reflective anode overlapping the light loss inducing layer;
    an organic light emitting layer between the reflective anode and the light loss inducing layer; and
    a transflective cathode between the organic light emitting layer and the light loss inducing layer.

16. The organic light emitting diode according to claim 15, further comprising:
    a touch electrode between the plurality of light shielding patterns and the transflective cathode, an entire width of the touch electrode overlapped by at least one of the plurality of light shielding patterns.

17. The organic light emitting diode according to claim 14, wherein the plurality of light shielding patterns are configured to absorb light incident on the plurality of light shielding patterns, and the light loss inducing layer is configured to reduce emission of reflected external light.

18. A manufacturing method of an organic light emitting diode, comprising:
    forming an anode on a substrate;
    forming a bank on the anode, the bank exposing a part of the anode to define an emission area;
    forming an organic light emitting layer on the emission area and the bank;
    forming a cathode on the organic light emitting layer; and
    forming a plurality of light shielding patterns and a light loss inducing layer on the cathode, the plurality of light shielding patterns configured to absorb light incident on the plurality of light shielding patterns, and the light loss inducing layer configured to reduce emission of reflected external light,
    wherein the plurality of light shielding patterns overlaps the bank, and the light loss inducing layer overlaps the emission area and is located on a same plane as the plurality of light shielding patterns such that the light loss inducing layer is disposed between a pair of light shielding patterns from the plurality of light shielding patterns, the light loss inducing layer having a same thickness as a thickness of the plurality of light shielding patterns.

19. The manufacturing method of an organic light emitting diode according to claim 18, wherein forming of the plurality of light shielding patterns and the light loss inducing layer on the cathode includes:
    patterning a photo-sensitive light shielding material by partially exposing and developing the photo-sensitive light shielding material after coating the photo-sensitive light shielding material on an entirety of the cathode; and
    simultaneously forming the plurality of light shielding patterns and the light loss inducing layer by fully exposing and developing a photo-sensitive light loss inducing material after coating the photo-sensitive light loss inducing material on an entirety of the patterned photo-sensitive light shielding material.

20. The manufacturing method of an organic light emitting diode according to claim 18, wherein forming of the plurality of light shielding patterns and the light loss inducing layer on the cathode includes:
    forming an opening in an area overlapping the bank by partially exposing and developing a photo-sensitive light loss inducing material after coating the photo-sensitive light loss inducing material on an entirety of the cathode; and
    simultaneously forming the plurality of light shielding patterns and the light loss inducing layer by fully exposing and developing a photo-sensitive light shielding material after coating the photo-sensitive light shielding material on an entirety of the photo-sensitive light loss inducing material in which the opening is formed.

* * * * *